US012463188B2

United States Patent
Yu et al.

(10) Patent No.: US 12,463,188 B2
(45) Date of Patent: Nov. 4, 2025

(54) FLIP-CHIP PACKAGED POWER TRANSISTOR MODULE HAVING BUILT-IN GATE DRIVER

(71) Applicants: ICP TECHNOLOGY CO., LTD., Taoyuan (TW); Sentec Green Energy Technology Co., Ltd., Taoyuan (TW)

(72) Inventors: Ho-Chieh Yu, Taoyuan (TW); Chen-Cheng-Lung Liao, Taoyuan (TW); Chun-Yu Lin, Taoyuan (TW); Jason An Cheng Huang, Taoyuan (TW); Chih-Chuan Liang, Taoyuan (TW); Kun-Tzu Chen, Taoyuan (TW); Nai-His Hu, Taoyuan (TW)

(73) Assignees: ICP TECHNOLOGY CO., LTD., Taoyuan (TW); Sentec Green Energy Technology Co., Ltd., Taoyuan (TW)

( * ) Notice: Subject to any disclaimer, the term of this patent is extended or adjusted under 35 U.S.C. 154(b) by 386 days.

(21) Appl. No.: 18/197,607

(22) Filed: May 15, 2023

(65) Prior Publication Data
US 2023/0378145 A1    Nov. 23, 2023

(30) Foreign Application Priority Data
May 19, 2022  (TW) .................................. 111118668

(51) Int. Cl.
*H01L 25/16*  (2023.01)
*H01L 23/00*  (2006.01)
*H01L 23/498* (2006.01)

(52) U.S. Cl.
CPC ........ *H01L 25/16* (2013.01); *H01L 23/49838* (2013.01); *H01L 24/05* (2013.01);
(Continued)

(58) Field of Classification Search
CPC ............... H01L 25/16; H01L 23/49838; H01L 2224/05552; H01L 2224/05553;
(Continued)

(56) References Cited

U.S. PATENT DOCUMENTS

9,721,860 B2 * 8/2017 Lopez ..................... H01L 23/13
2014/0183543 A1 * 7/2014 Disney ............. H01L 23/49562
   438/123
(Continued)

*Primary Examiner* — Mamadou L Diallo
(74) *Attorney, Agent, or Firm* — Che-Yang Chen; Law Office of Michael Chen (57) ABSTRACT

Disclosed is a flip-chip packaged power transistor module having a built-in gate driver, for outputting a high-power signal of at least tens of amperes, the module including at least one power transistor die which has an active side where at least one source pin, at least one drain pin and at least one gate pin are exposed; a ceramic substrate body which has a conducting junction side and a heat spreading side, a minimal spacing of the gate bonding pad from at least one of the source bonding pad or the drain bonding pad being less than 500 μm, whereby parasitic inductance generated therebetween is reduced; at least one gate driver which has at least one gate pin configured to be soldered to the gate bonding pad, and at least one gate drive pin which corresponds to the gate pin and is configured to be soldered to the drive bonding pad.

7 Claims, 7 Drawing Sheets

(52) U.S. Cl.
CPC .... *H01L 24/06* (2013.01); *H01L 2224/05552* (2013.01); *H01L 2224/05553* (2013.01); *H01L 2224/06051* (2013.01); *H01L 2224/06155* (2013.01)

(58) Field of Classification Search
CPC ........... H01L 23/4824; H01L 23/49844; H01L 24/05; H01L 24/06; H01L 2224/06051; H01L 23/36; H01L 2224/81
See application file for complete search history.

(56) References Cited

U.S. PATENT DOCUMENTS

| | | | |
|---|---|---|---|
| 2019/0115291 A1* | 4/2019 | Chen | H01L 24/48 |
| 2022/0278021 A1* | 9/2022 | Nootens | H01L 23/10 |
| 2023/0097816 A1* | 3/2023 | Tuncer | H01L 24/05 |
| | | | 257/773 |
| 2023/0260935 A1* | 8/2023 | Kabir | H01L 23/5227 |
| | | | 257/728 |

* cited by examiner

Prior art

Fig. 1

Prior art

FLIP-CHIP PACKAGED POWER TRANSISTOR MODULE HAVING BUILT-IN GATE DRIVER

FIELD

Embodiments of the disclosure relate to a power device module, and more particularly relate to a flip-chip packaged power transistor module having a built-in gate driver.

BACKGROUND

Over the past decades, power semiconductors such as MOSFET and IGBT have been constantly innovated in aspects of materials, structures, and circuit designs, and the performance of electronic products has increased stably in line with the Moore's law. Silicon (Si) is the main material used in traditional transistors. Although the raw material is easily accessible and the fabrication process has been mature, traditional transistors gradually cannot meet the needs of current electric vehicles and 5G communication technologies due to inherent physical limits of silicon. With the electric vehicle as an example, an inverter inside the vehicle is configured to output a control signal to actuate a three-phase motor; this inverter may be regarded as a power device module, which relies on a microcontroller unit (MCU) to transmit a control signal to the gate of the power transistor; the direct current (DC) outputted from the battery needs to be further subjected to for example pulse width modulation (PWM) to form a high-frequency, high-current alternative-current (AC) signal conducted between the source and the drain of the power transistor in the inverter, and the high-frequency, high-current AC signal is finally supplied to for example the three-phase motor for high-power output.

The input signal of the three-phase motor is a three-phase AC signal, with each phase 120° apart. Frequency of the AC signal dictates a revolving speed of the motor, and current magnitude of the AC signal directly influences the magnetic force actuating the motor. Therefore, it may be understood that a high-power electric vehicle motor needs a high-frequency, high-current AC input signal. For silicon-based traditional first/second-generation semiconductors, for example, with a bandgap of 1.12 eV and a breakdown field of 0.3 MV/cm, they are easily broken down in a high-voltage, high-current operating environment. Third-generation semiconductors such as GaN are admirably adapted to high-frequency signals due to their wider bandgap (3.4 eV) and higher breakdown field (3.3 MV/cm), which may satisfy the need of high-power motors; in addition, they may form a high electron mobility transistor (HEMT) using the two-dimensional electron gas (2 DEG) generated on the interface due to the polarization difference resulting from their AlGaN/GaN heterostructure. Therefore, the GaN-based devices can be applied to high-frequency, high-power, radiation-resistant, and high-temperature environments, including high-power output amplifiers for 5G communication base stations, military radars, rechargeable batteries, and vehicle energy management systems, etc.

On the other hand, although the MCU may transmit a logic signal to the gate of a power transistor to perform switching control, the power transistor would be unable to keep pace with the signal switching speed if the signal has a very high frequency, because the gate of the power transistor, which may be regarded as a capacitor, cannot conduct the signal between the source and the drain without enough charges accumulated at the gate if the power transistor is a normally-off power transistor. Therefore, the gate needs a higher-frequency, higher-current signal input to keep pace with instantaneous changes of the signal. In practice, a conventional solution is to amplify the control signal in advance via a gate driver.

Gate drivers can be generally provided either on-chip or as a discrete module. An on-chip gate driver can save much space since the gate driver and the power semiconductor are directly integrated into a monolithic chip; however, if the power transistor creates a high temperature, the gate driver and the MCU would be adversely affected. A discrete gate driver enables a proper thermal isolation; however, the overly redundant circuit design likely causes distortion of the transmitted high-frequency signal due to parasitic inductance effect. The drawbacks above would have a significant impact on the power semiconductor; once issues such as phase delay and distortion of the gate signal arise, the accuracy of power semiconductor modulation would be affected. With the electric-vehicle three-phase motor as an example, if each AC signal phase inputted cannot maintain 120° apart, the operating efficiency of the motor would be significantly affected.

Figure 1:
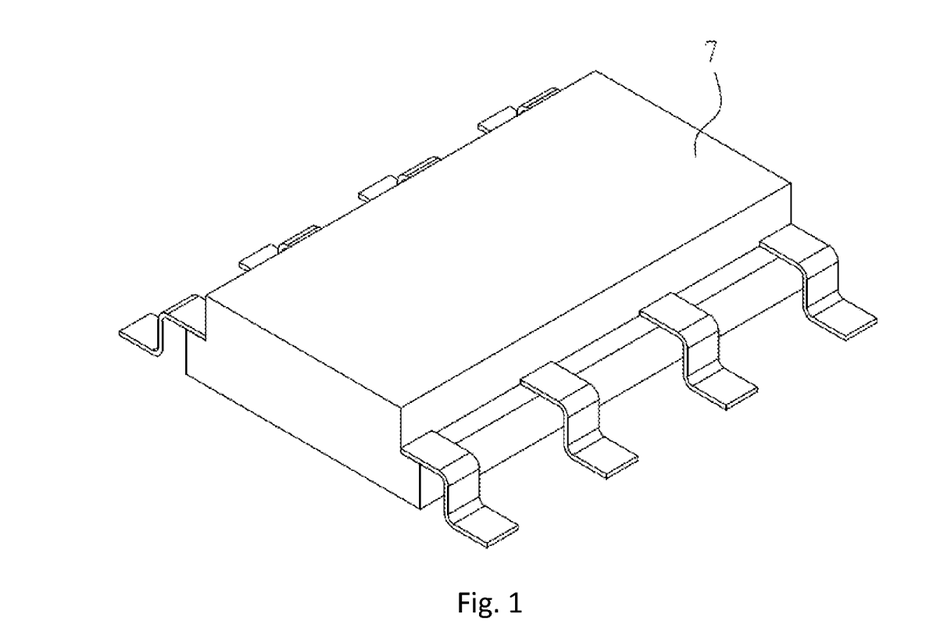
FIG. 1 is a stereoscopic schematic diagram of a known power device, illustrating a package structure of resin material.
Figure 2:
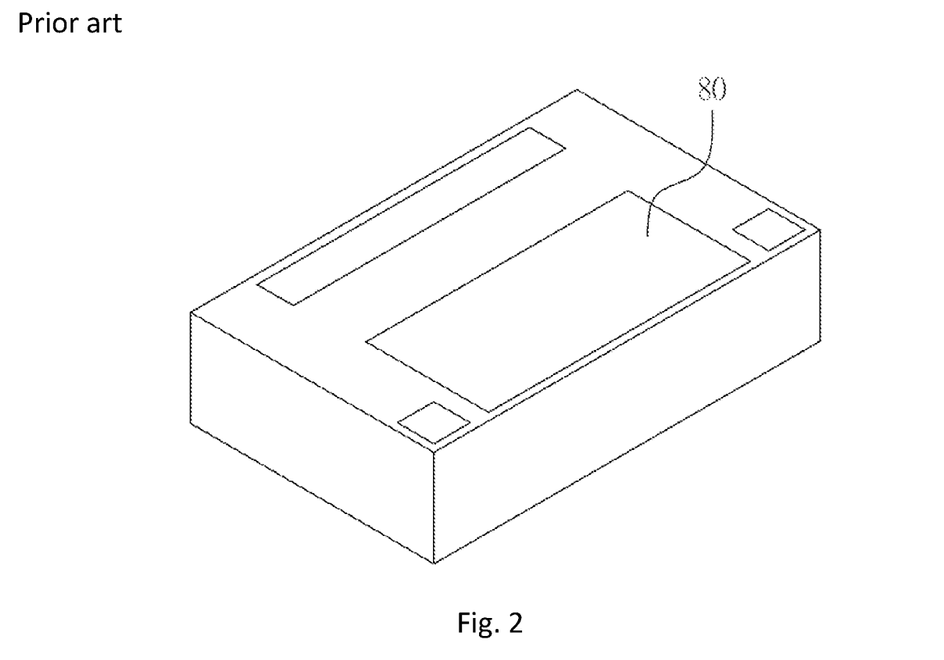
FIG. 2 is a stereoscopic schematic diagram of another known power device.

FIG. 1 illustrates a conventional semiconductor device 7, which has a poor thermal conductivity due to use of an insulating resin material for isolation purposes. FIG. 2 further illustrates a GaN power transistor product manufactured by GaN Systems, a Canadian company, where a copper layer applied to the bottom solder side is used as a surface-mounted heat sink electrode 80 in an attempt to improve heat spreading effect of the power device. However, in the structure illustrated in FIG. 2, since a dielectric layer is still arrayed between the copper layer and the power device die and heat is conducted to peripheral edges of the package via a through-hole and a heat conduction column, its bottom-side heat spreading effect is still limited. Furthermore, in the GaN power transistor product, after the power device die is fully packaged by a resin material into a power semiconductor device, the packaged power semiconductor device is soldered onto a circuit board, whereby a signal from an externally matched gate driver is conducted to the gate of the power semiconductor device via lead wires or lead frames arrayed on the circuit board. In addition to the drawback in heat dissipation, such configuration can hardly eliminate parasitic inductance and control signal delay when being applied to a high-frequency signal operating condition, because to prevent mutual interference and collision between the power device and the gate driver mounted on the circuit board, the mounting pads shall also be spaced with a certain interval on the circuit board, a consequence of which is that the gate driver and the driven gate are also distantly spaced.

In view of the above, the gate driver, which plays a critical role in a high-frequency, high-power power transistor application, faces both challenges of parasitic inductance and power transistor-generated heat. To tackle these challenges, the disclosure provides a flip-chip packaged power transistor module having a built-in gate driver, where a chip die of a power device is directly flip-chip bonded on a ceramic substrate and the gate driver is also mounted on the ceramic substrate in very close proximity to the chip die. In this way, the spacing between the gate driver and the gate is made very close, which effectively reduces parasitic inductance and signal delay; in addition, the active side of the power transistor die directly contacts the metal conductive layer, enabling heat to be conducted out through the ceramic substrate; furthermore, direct bonded copper (DBC) may be applied to the outer side of the ceramic substrate, such that the high heat generated by the power device can be smoothly conducted out via the ceramic substrate with a large contact area while the gate driver is not affected. A main technical problem to be solved by the disclosure is how to significantly reduce parasitic inductance and power device-generated heat.

SUMMARY

An objective of the disclosure is to provide a power transistor module, wherein the spacing between a power transistor and a gate driver is reduced by integrating the power transistor die and the gate driver onto electrode bonding pads of a same ceramic substrate, whereby parasitic inductance is effectively reduced.

Another objective of the disclosure is to provide a power transistor module, wherein a power transistor die is flip-chip packaged on a ceramic substrate and the active side of the die directly contacts a source bonding pad and a drain bonding pad on a conducting junction side in a large area, such that the active side of the die transfers heat significantly to the ceramic substrate via the conducting junction side, whereby heat generated by the operating power transistor is smoothly conducted out.

A further objective of the disclosure is to provide a power transistor module, wherein a copper layer is bonded/plated onto the surface of a ceramic substrate by DBC or DPC, and a photoetching technology is applied to reduce the spacing between electrode bonding pads to about 500 μm, whereby parasitic inductance effect is reduced.

A still further objective of the disclosure is to provide a power transistor module, wherein a photoetching technology is applied to enable the active side of the electrode bonding pads to precisely correspond to and overlap with the active side of the electrode pins, whereby current sectional area and het conduction sectional area are maximized.

A yet still objective of the disclosure is to provide a power device module, wherein a thermally insulating layer with a thermal conductivity lower than that of ceramics is sandwiched between a gate bonding pad and a ceramic substrate body and between a drive bonding pad and the ceramic substrate body, respectively, resulting in that heat generated by the power transistor die is less unlikely conducted to the gate driver, which ensures that the operating environment is not affected by the heat generated by the power transistor.

A power transistor module disclosed by the disclosure is configured for a user to output a high-power signal of at least tens of amperes, the power transistor module comprising: at least one power transistor die which has an active side where at least one source pin, at least one drain pin, and at least one gate pin are exposed; a ceramic substrate body which has a conducting junction side and a heat spreading side opposite the conducting junction side, wherein on the conducting junction side are formed a source bonding pad corresponding to the source pin, a drain bonding pad which is insulated from the source bonding pad and corresponds to the drain pin, a gate bonding pad which is insulated from the source bonding pad and the drain bonding pad and corresponds to the gate pin, and a drive bonding pad which is insulatively spaced from and corresponds to the gate bonding pad; wherein a minimal spacing of the gate bonding pad from at least one of the source bonding pad or the drain bonding pad is less than 500 μm, whereby parasitic inductance generated therebetween is reduced; and at least one gate driver, which has at least one gate pin configured to be soldered to the gate bonding pad, and at least one gate drive pin which corresponds to the gate pin and is configured to be soldered to the drive bonding pad.

The power transistor module according to the disclosure reduces the spacing between the gate bonding pad and the drive bonding pad to effectively reduce parasitic inductance effect by directly flip-chip bonding the active side of the power transistor die, which is suitable for high-power, high-frequency applications, to the electrode bonding pad of the ceramic substrate, where the electrode bonding pad is precisely photoetched from a DBC or DPC copper layer; meanwhile, the power transistor module according to the disclosure maximizes the current sectional area and the heat conduction surface by making the surface of the source bonding pad and the surface of the drain bonding pad to precisely correspond to the source pin and the drain pin of the transistor; in addition, by mounting a thermally insulating layer with a thermal conductivity lower than that of the ceramic between the gate bonding pad and the ceramic substrate body and between the drive bonding pad and the ceramic substrate body, respectively, the gate driver arrayed in close proximity is immune from the high temperature created by the operating power transistor; furthermore, by mounting a metallic heat spreader onto the heat spreading side of the ceramic substrate body, the packaged power module as a whole has a good heat dissipation course. The disclosure is thus adapted to the high-current, high-frequency signal trend of third-generation semiconductors and offers a feasible power transistor module solution to tackle the parasitic inductance issue caused by high temperature and high frequency of high-power semiconductors.

DETAILED DESCRIPTION

The technical contents, features, and effects of the disclosure may become apparent through detailed description of the examples with reference to the figures, where like elements throughout the examples will be represented by identical or similar reference numerals.

FIGS. 3 to 7 illustrate a first example of a power transistor module 1 according to the disclosure, where a substrate, a transistor, a driver, and a module are sequentially illustrated; the power transistor module 1 comprises a power transistor die 2, a ceramic substrate body 3, and a gate driver 4.

Figure 3:
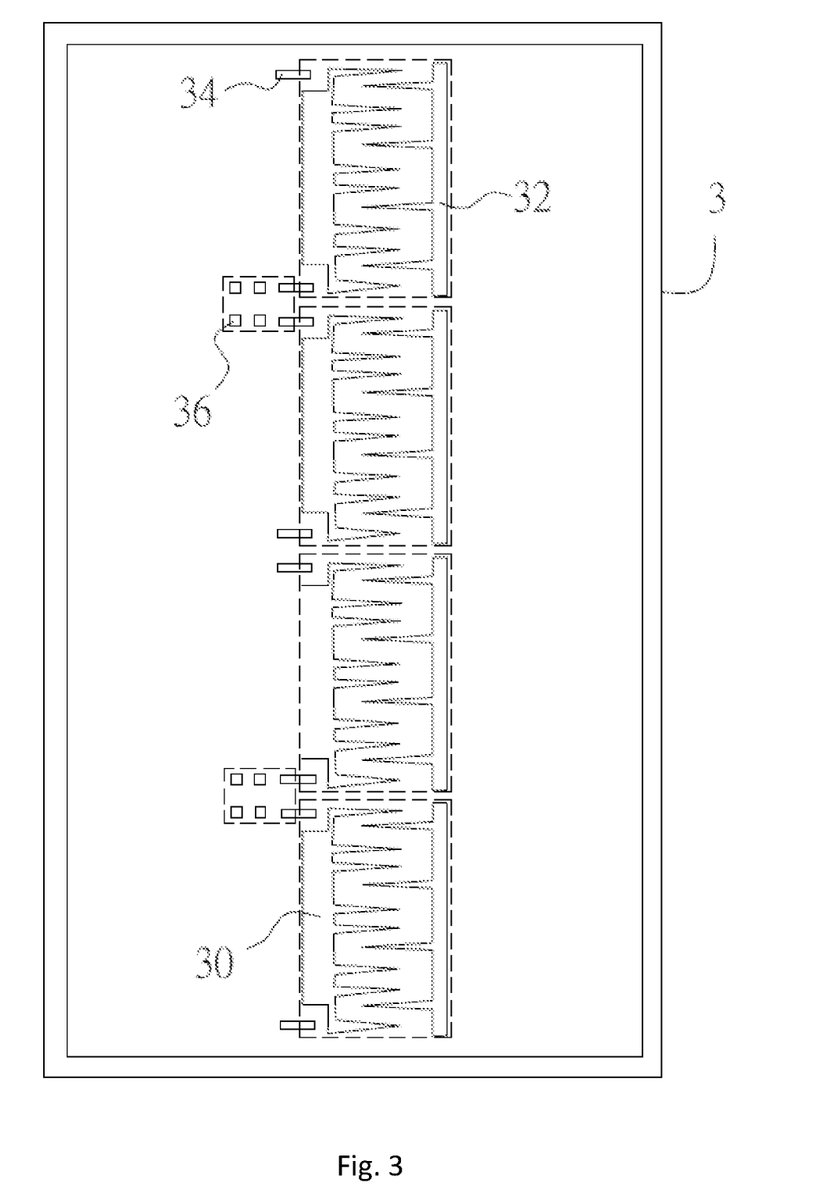
FIG. 3 is a top view of a conducting junction side of a ceramic substrate body in a first example of the power transistor module according to the disclosure, illustrating a source bonding pad, a drain bonding pad, a gate bonding pad, a drive bonding pad corresponding to the gate driver, and a relative position of the drive bonding pad.

To enhance thermal dissipation efficiency, a ceramic substrate body 3 illustrated in FIG. 3 is adopted by the disclosure, where the direct bonded copper (DBC) technology is applied to etch out a circuit layer on a conducting junction side of the ceramic substrate body 3. The circuit layer comprises, for example, four power transistor bonding pads for directly flip-chip bonding the active side of the power transistor die 2; as such, each power transistor bonding pad further comprises a corresponding source bonding pad 30, a corresponding drain bonding pad 32, and a corresponding gate bonding pad 34. It is noted that the circuit layer in this example is photoetched, allowing for the bonding pads of the transistor to be shaped to precisely correspond to transistor pins, whereby the current sectional area is maximized and the heat conduction area is also maximized.

Figure 4:
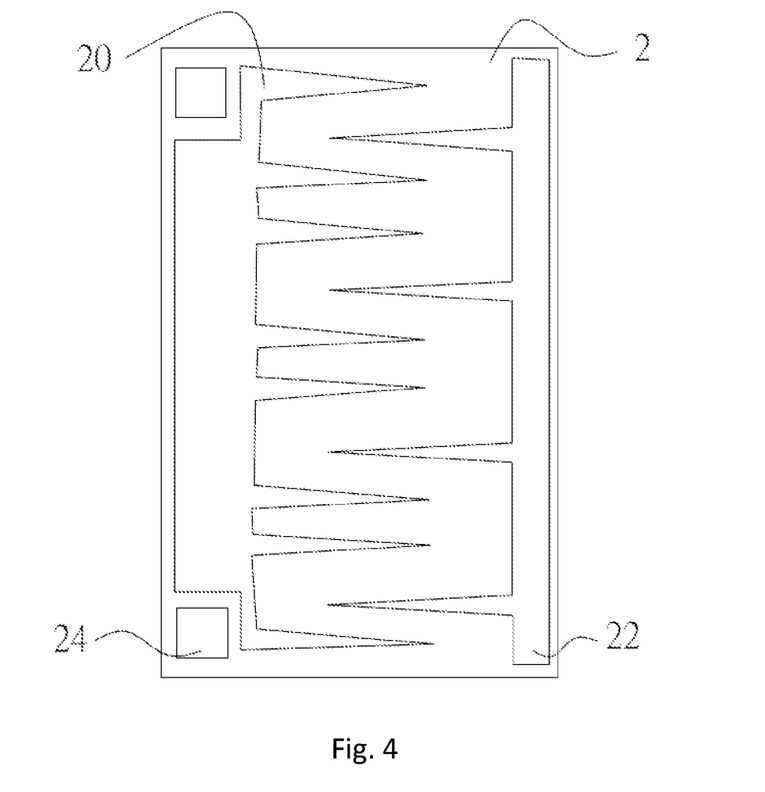
FIG. 4 is a bottom view of the active side of a power device die, illustrating positions of the source, the drain, and the gate.

As illustrated in FIG. 4, the power transistor die 2 in this example is a GaN-based transistor die. Since the disclosure directly uses an unpackaged chip die, the source, drain, and gate of the power transistor die 2 are directly exposed on the bottom side of the die. To ease the description, the bottom side is herein defined as the active side; and the source, the drain, and the gate exposed on the active side are referred to as a source pin 20, a drain pin 22, and a gate pin 24. In the known technology, the die of the power transistor is pre-packaged, such that even the insulating package housing itself has a poor thermal conductivity; in addition, the packaged power transistor die is further surface-mounted onto the circuit board, while the mounting pads generally have fabrication and mounting tolerances, which would undoubtedly increase thermal resistance of the conduction path. In contrast, in the present disclosure, the source bonding pad 30, the drain bonding pad 32, and the gate bonding pad 34 are very precisely formed on the ceramic substrate body, which not only effectively reduces the spacing between the bonding pads, but also may increase the copper layer thickness of the bonding pads traversed by the current; this offers a lower current density than conventional lead frames.

Figure 5:
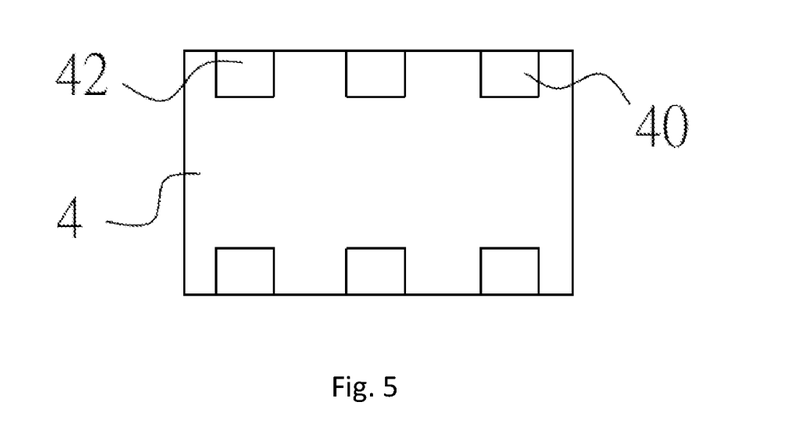
FIG. 5 is a bottom view of the gate driver, illustrating a gate output pin and a gate drive pin.

In this example, as illustrated in FIG. 5, a gate driver 4 is provided to correspondingly match the power transistor die 2; the bottom side of the grate driver 4 has two gate output pins 40, two gate drive pins 42, one ground pin, and one Vcc pin. Those skilled in the art would appreciate that the internal design and the number of pins of power transistors or gate drivers of different manufacturers or even different models are likely also different. The transistor device selected here is only an example for illustrative purposes, which should not be understood as a limiting condition.

The power transistor die 2 in this example has two gate pins 24; in use, it is only needed to connect the gate driver 4 to either of the gate pins 24; in order to drive two adjacent power transistor dies simultaneously, the gate bonding pad 34 only for securely soldering the gate pin and the drive bonding pad 36 actually for mounting the gate driver are provided on the ceramic substrate body 3. In use, a logic, digital signal may be transmitted to the gate driver 4 by a microcontroller unit (MCU) via the drive bonding pad 36, then the signal is outputted to the gate pin 24 of the power transistor die 2 via the gate bonding pad 34 so as to perform, for example pulse width modulation (PWM), to a high-power signal, and finally the modulated signal is outputted via the drain pin 22.

Figure 6:
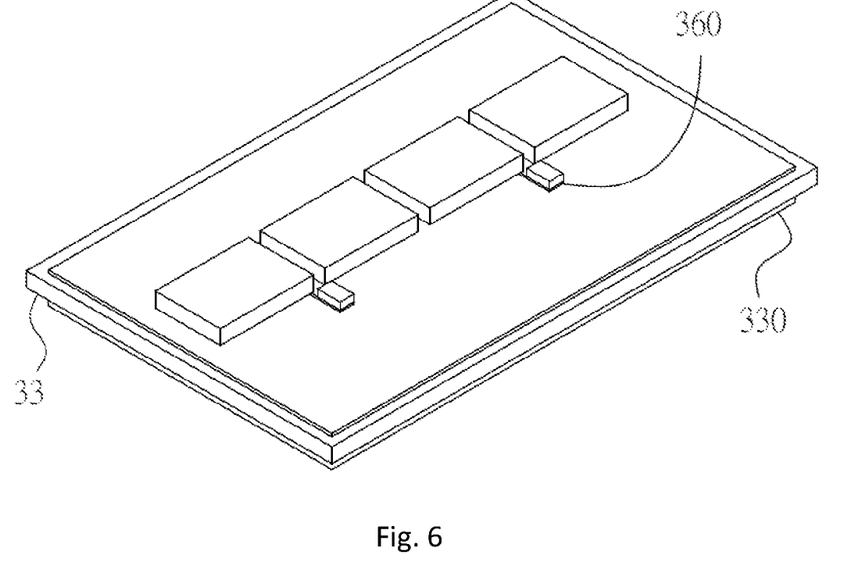
FIG. 6 is a stereoscopic diagram of the power transistor module before being packaged according to the first example of the disclosure.

Therefore, a feature of this example lies in that the power transistor die 2 and the gate driver 4 are directly conductively connected via one gate bonding pad 34, whereby the mounting spacing between the power transistor die 2 and the gate driver 4 may be reduced to be for example less than 500 µm, significantly reducing parasitic inductance and signal delay; on the other hand, in view that the operating temperature of the power transistor die 2 is always one or two hundred degrees Celsius or above, in this example, a thermally insulating layer 360 with a thermal conductivity lower than that of the ceramic substrate body 3 is further sandwiched between the ceramic substrate body 3 and the gate drive bonding pad so as to prevent adversely affecting the gate driver 4 in close proximity, as illustrated in FIG. 6, where the thermally insulating layer 360 is exemplarily illustrated as a solder mask with a thickness of about 25 µm. In an alternative example, the thermally insulating layer 360 may be a die-bonding resin. In this way, after the heat generated by the power transistor die 2 is conducted sequentially to the power transistor bonding pads and the ceramic substrate body 3, the heat is less likely spread towards the gate drive bonding pad, whereby the operating temperature of the gate driver is not affected.

Figure 7:
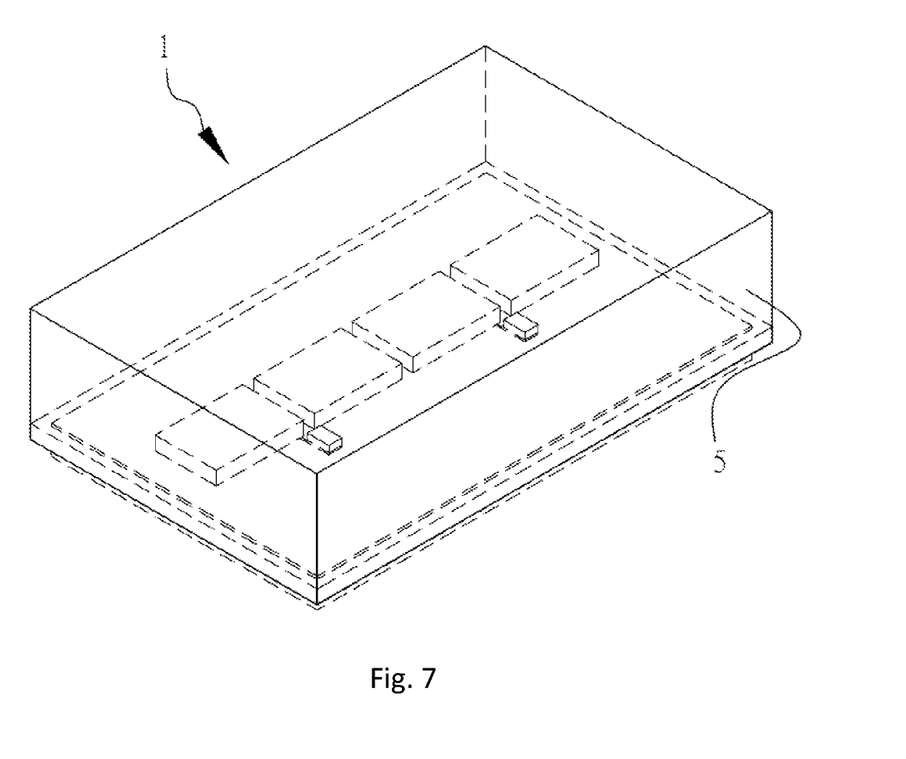
FIG. 7 is a stereoscopic diagram of the power transistor module of FIG. 6 after being packaged.

In this example, the ceramic substrate body 3 itself has a good thermal conductivity; the side opposite the conducting junction side is referred to a heat spreading side 33. When the operating power transistor die 2 generates heat causing temperature elevation of the ceramic substrate body 3, the heat accumulated may be conducted via the copper layer and the ceramic substrate body and then released via the heat spreading side 33 since the pins of the power transistor die are shaped completely consistent with the bonding pads on the ceramic substrate body, which maximizes the contact area between the power transistor die and the ceramic substrate. In this example, a DBC (Direct Bonded Copper) or DPC (Direct Plate Copper) layer as a metallic heat spreader 330 is further provided on the heat spreading side 33, and where it is necessary, a heat conducting device such as a heat sink fin or a heat conducting pipe may be further arranged on the heat spreading copper layer; therefore, although the periphery of the ceramic substrate body 3 is packaged by a dielectric packaging layer 5, design of the heat spreading side 33 and the metallic heat spreader 330 can still effectively prevent heat accumulation within the dielectric packaging layer 5, which ensures that the internal components are always kept in a good operating temperature environment.

Figure 8:
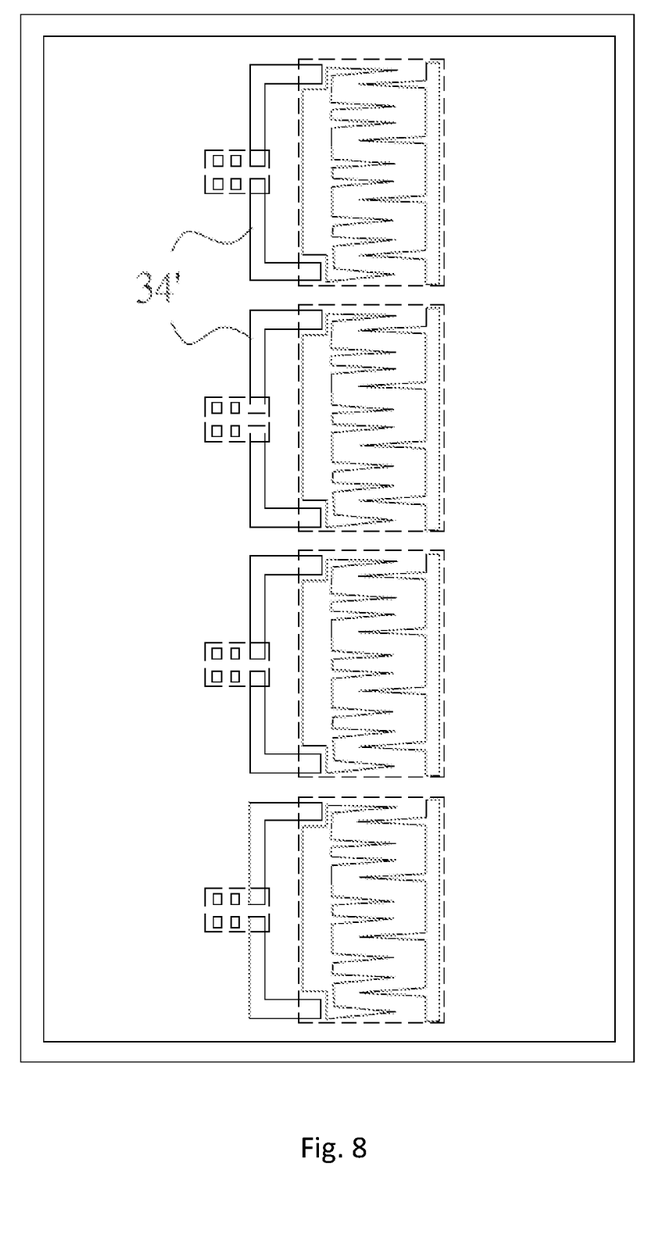
FIG. 8 through FIG. 10 are schematic diagrams of a second example of the power transistor module according to the disclosure, illustrating that one gate driver may drive one power device.
Figure 9:
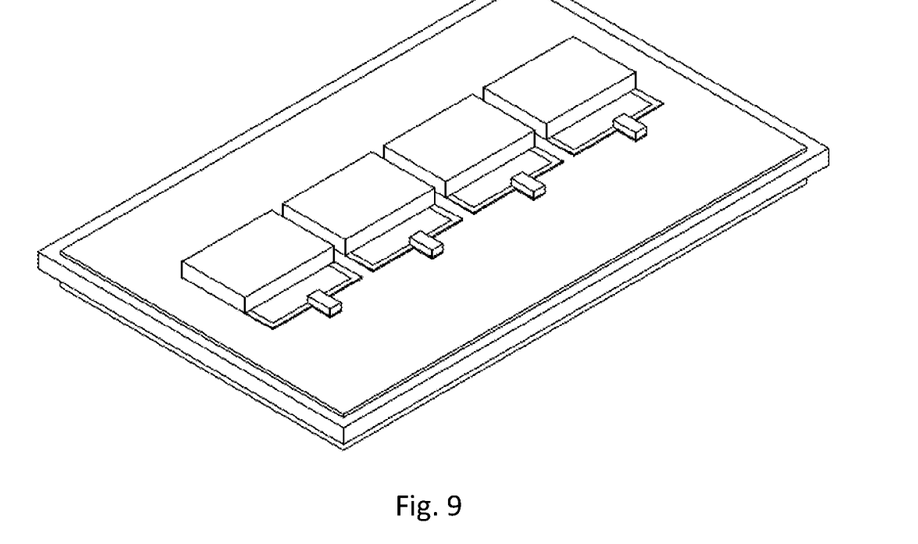
Figure 10:
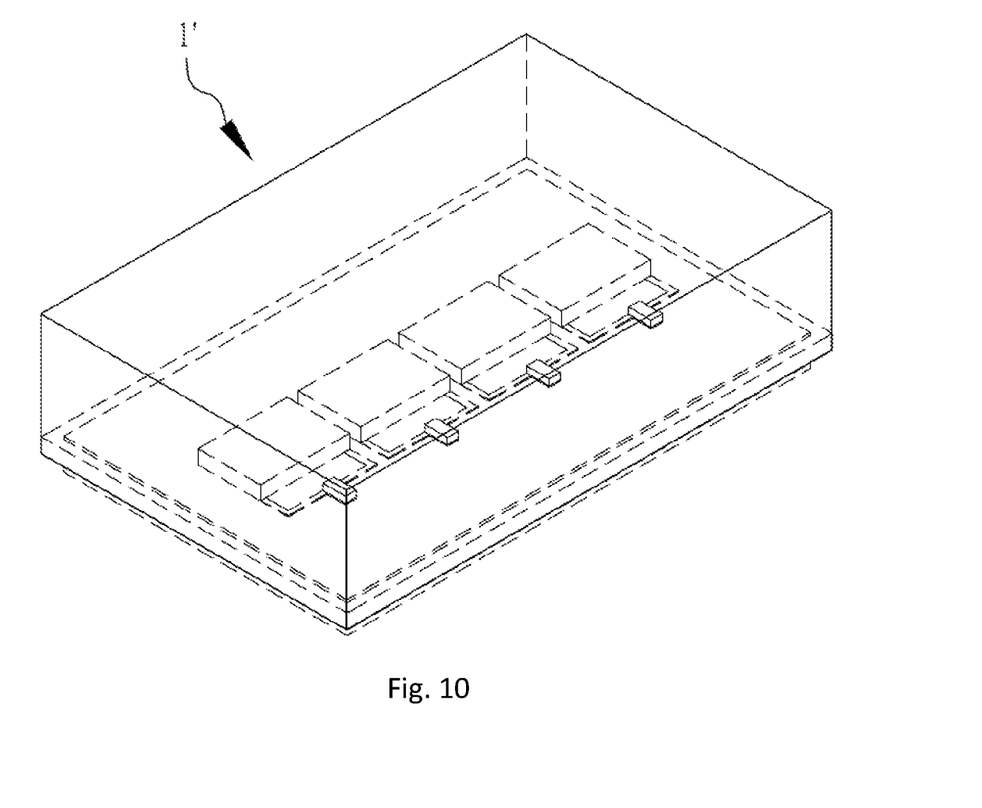

FIGS. 8 through 10 illustrate a second example of a power transistor module 1' according to the disclosure, those parts of which identical to the first example will not be detailed here. The main difference of this example lies in a structure in which one gate driver corresponds to one power transistor die; specifically, two gate bonding pads 34' of the same transistor are connected to the bonding pads of the same driver; this symmetrical design offers a better driving effect for a specific transistor chip, leading to more stable, consistent output of signals. However, in practice, it is also allowed that only one gate bonding pad 34' of the transistor is connected to one bonding pad of the driver; therefore, the description of the second example shall not be understood as a limiting condition for the disclosure.

Figure 11:
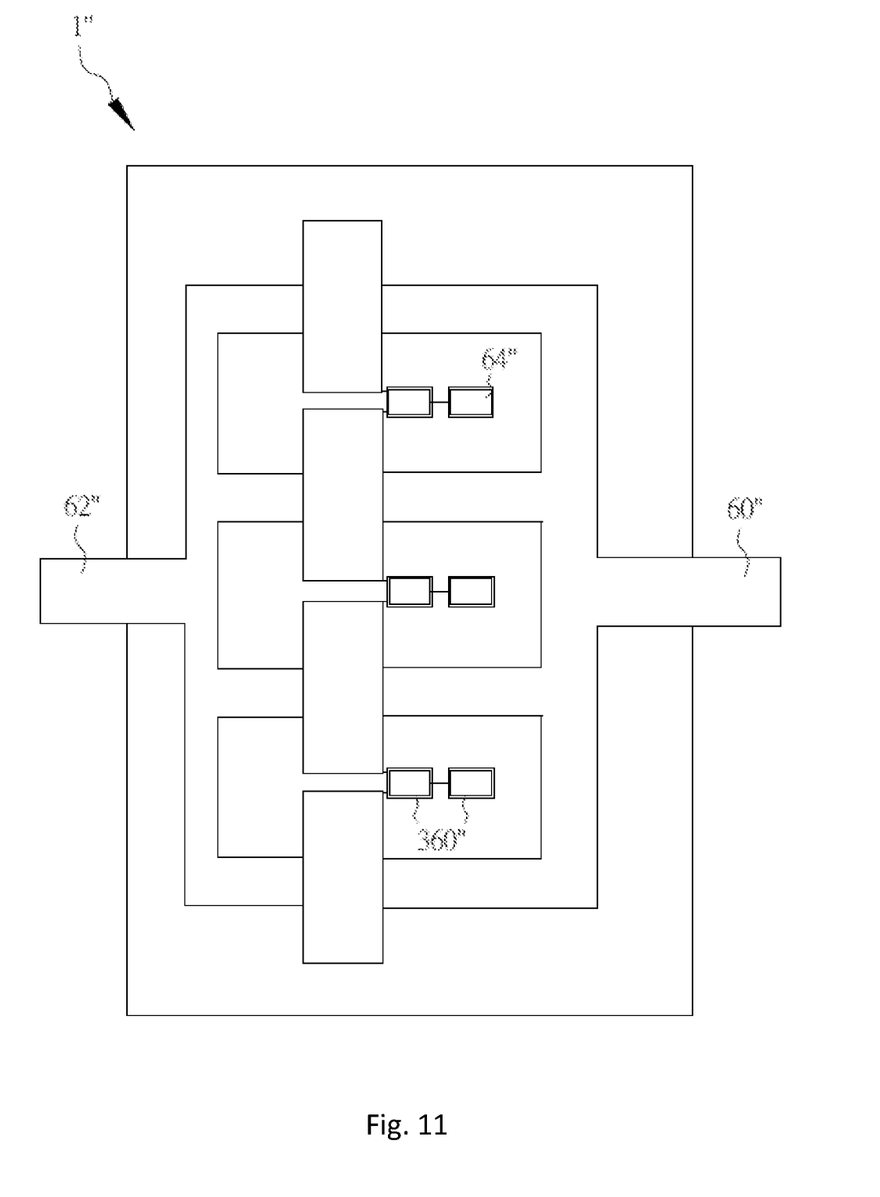
FIG. 11 is a schematic diagram of a third example of the power transistor module according to the disclosure.

FIG. 11 illustrates a third example of the power transistor module 1" according to the disclosure, where those parts identical to the preceding two examples will not be detailed here. In this example, the input end of the power module is an input lead-wire layer 60", which is internally parallel connected to the sources of for example two power transistor dies, each power transistor being connected to two gate drivers, whereby the high-frequency output signal from each power transistor is more uniform. Moreover, each gate driver is controlled by one microcontroller unit 64", and a thermally insulating layer 360" is likewise disposed beneath the microcontroller unit 64". In this example, the control signal path of each microcontroller unit 64" has an equal length to that of the gate driver, such that no phase difference is caused between the power transistor dies, whereby the overall signal is more uniformly outputted from the output conductive layer 62".

The power transistor module disclosed above improves thermal conduction by proximity arrayment of the power transistor die and the gate driver via flip-chip packaging and a high overlap area between the transistor pins and bonding pads; on the other hand, providing of thermally insulating pads eliminates the thermal conduction impact on proximally arrayed devices. The examples provided above are only for facilitating understanding, rather than for limiting. Any equivalent effect generated from and other alterations and modifications made according to the structures set out in the appended claims of the disclosure shall fall within the protection scope of the disclosure.

We claim:

1. A flip-chip packaged power transistor module having a built-in gate driver, configured to output a high-power signal of at least tens of amperes, wherein the flip-chip packaged power transistor module comprises:
    at least one power transistor die which has an active side where at least one source pin, at least one drain pin, and at least one gate pin are exposed;
    a ceramic substrate body which has a conducting junction side and a heat spreading side opposite the conducting junction side, wherein on the conducting junction side are formed a source bonding pad corresponding to the source pin, a drain bonding pad which is insulated from the source bonding pad and corresponds to the drain pin, a gate bonding pad which is insulated from the source bonding pad and the drain bonding pad and corresponds to the gate pin, and a drive bonding pad which is insulatively spaced from and corresponds to the gate bonding pad; wherein a minimal spacing of the gate bonding pad from at least one of the source bonding pad or the drain bonding pad is less than 500 µm, whereby parasitic inductance generated therebetween is reduced;
    and at least one gate driver, which has at least one gate pin configured to be soldered to the gate bonding pad, and at least one gate drive pin which corresponds to the gate pin and is configured to be soldered to the drive bonding pad.

2. The flip-chip packaged power transistor module having a built-in gate driver according to claim 1, further comprising a dielectric packaging layer configured to package the power transistor die, the gate driver, and the conducting junction side.

3. The flip-chip packaged power transistor module having a built-in gate driver according to claim 1, further comprising a metallic heat spreader provided on the heat spreading side of the ceramic substrate body.

4. The flip-chip packaged power transistor module having a built-in gate driver according to claim 1, wherein a thermally insulating layer with a thermal conductivity lower than that of the ceramic substrate body is further sandwiched between the gate bonding pad and the ceramic substrate body and between the drive bonding pad and the ceramic substrate body, respectively, resulting in that heat generated by the power transistor die is less likely conducted to the gate bonding pad and the drive bonding pad.

5. The flip-chip packaged power transistor module having a built-in gate driver according to claim 4, wherein the thermally insulating layer refers to a die-bonding resin or a solder mask with a thickness of 5 to 50 µm.

6. The flip-chip packaged power transistor module having a built-in gate driver according to claim 1, wherein at least the source bonding pad and the drain bonding pad are etched from a copper substrate directly eutectic bonded onto the ceramic substrate body.

7. The flip-chip packaged power transistor module having a built-in gate driver according to claim 1, wherein a surface area of the source bonding pad precisely corresponds to the source pin, and the drain bonding pad precisely corresponds to the drain pin, whereby current area and thermal conduction area are maximized.

\* \* \* \* \*